United States Patent
Lee et al.

(10) Patent No.: US 9,356,106 B2
(45) Date of Patent: May 31, 2016

(54) METHOD TO FORM SELF-ALIGNED HIGH DENSITY NANOCRYSTALS

(71) Applicants: Euhngi Lee, Austin, TX (US); Sung-Taeg Kang, Austin, TX (US)

(72) Inventors: Euhngi Lee, Austin, TX (US); Sung-Taeg Kang, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/476,827

(22) Filed: Sep. 4, 2014

(65) Prior Publication Data
US 2016/0071943 A1 Mar. 10, 2016

(51) Int. Cl.
| | |
|---|---|
| *H01L 21/20* | (2006.01) |
| *H01L 29/423* | (2006.01) |
| *H01L 29/792* | (2006.01) |
| *H01L 21/28* | (2006.01) |
| *H01L 21/324* | (2006.01) |
| *H01L 21/308* | (2006.01) |
| *H01L 21/02* | (2006.01) |

(52) U.S. Cl.
CPC .... *H01L 29/42348* (2013.01); *H01L 21/02532* (2013.01); *H01L 21/28282* (2013.01); *H01L 21/308* (2013.01); *H01L 21/324* (2013.01); *H01L 29/42344* (2013.01); *H01L 29/792* (2013.01)

(58) Field of Classification Search
CPC ............. H01L 21/282282; H01L 21/324; H01L 21/02532; H01L 29/42344; H01L 29/792; H01L 29/42348; H01L 29/66825; H01L 21/28273; B82Y 10/00
See application file for complete search history.

(56) References Cited

U.S. PATENT DOCUMENTS

| | | | | |
|---|---|---|---|---|
| 5,670,279 | A * | 9/1997 | Goldstein | G03F 1/22 257/E21.114 |
| 6,656,792 | B2 | 12/2003 | Choi et al. | |
| 6,808,986 | B2 * | 10/2004 | Rao | B82Y 10/00 257/E21.101 |
| 7,112,490 | B1 * | 9/2006 | Hong | B82Y 10/00 257/302 |
| 7,491,600 | B2 * | 2/2009 | Prinz | B82Y 10/00 257/E21.245 |
| 7,544,625 | B2 * | 6/2009 | Joshi | C23C 16/30 257/E21.252 |
| 7,799,634 | B2 | 9/2010 | Shen et al. | |
| 7,871,886 | B2 | 1/2011 | Hong et al. | |
| 8,329,544 | B2 | 12/2012 | Kang et al. | |
| 8,501,563 | B2 | 8/2013 | Sandhu et al. | |
| 8,679,912 | B2 * | 3/2014 | Kang | H01L 21/28273 365/159 |
| 8,709,892 | B2 * | 4/2014 | Mao | B82Y 10/00 257/E29.3 |
| 8,779,405 | B2 * | 7/2014 | Zhou | H01L 45/04 257/2 |
| 8,803,217 | B2 | 8/2014 | Rao et al. | |
| 8,916,923 | B2 * | 12/2014 | Ohba | B82Y 10/00 257/325 |
| 9,082,650 | B2 * | 7/2015 | Perera | H01L 21/28273 |

(Continued)

*Primary Examiner* — Savitr Mulpuri

(57) ABSTRACT

Methods for fabricating dense arrays of electrically conductive nanocrystals that are self-aligned in depressions at target locations on a substrate, and semiconductor devices configured with nanocrystals situated within a gate stack as a charge storage area for a nonvolatile memory (NVM) device, are provided.

15 Claims, 8 Drawing Sheets

(56) References Cited

U.S. PATENT DOCUMENTS

| | | | | |
|---|---|---|---|---|
| 2003/0060005 A1* | 3/2003 | Furukawa | H01L 27/1087 | 438/243 |
| 2007/0018216 A1* | 1/2007 | Chindalore | H01L 27/115 | 257/296 |
| 2007/0018221 A1* | 1/2007 | Swift | B82Y 10/00 | 257/301 |
| 2007/0018222 A1* | 1/2007 | Sadd | B82Y 10/00 | 257/301 |
| 2007/0018232 A1* | 1/2007 | Chindalore | B82Y 10/00 | 257/316 |
| 2007/0018240 A1* | 1/2007 | Chindalore | B82Y 10/00 | 257/330 |
| 2009/0243048 A1 | 10/2009 | Dufoureq et al. | | |
| 2009/0246510 A1 | 10/2009 | Dufoureq et al. | | |
| 2012/0172211 A1* | 7/2012 | Lu | B01J 23/38 | 502/240 |
| 2012/0261647 A1* | 10/2012 | Marsh | B82Y 10/00 | 257/29 |

* cited by examiner

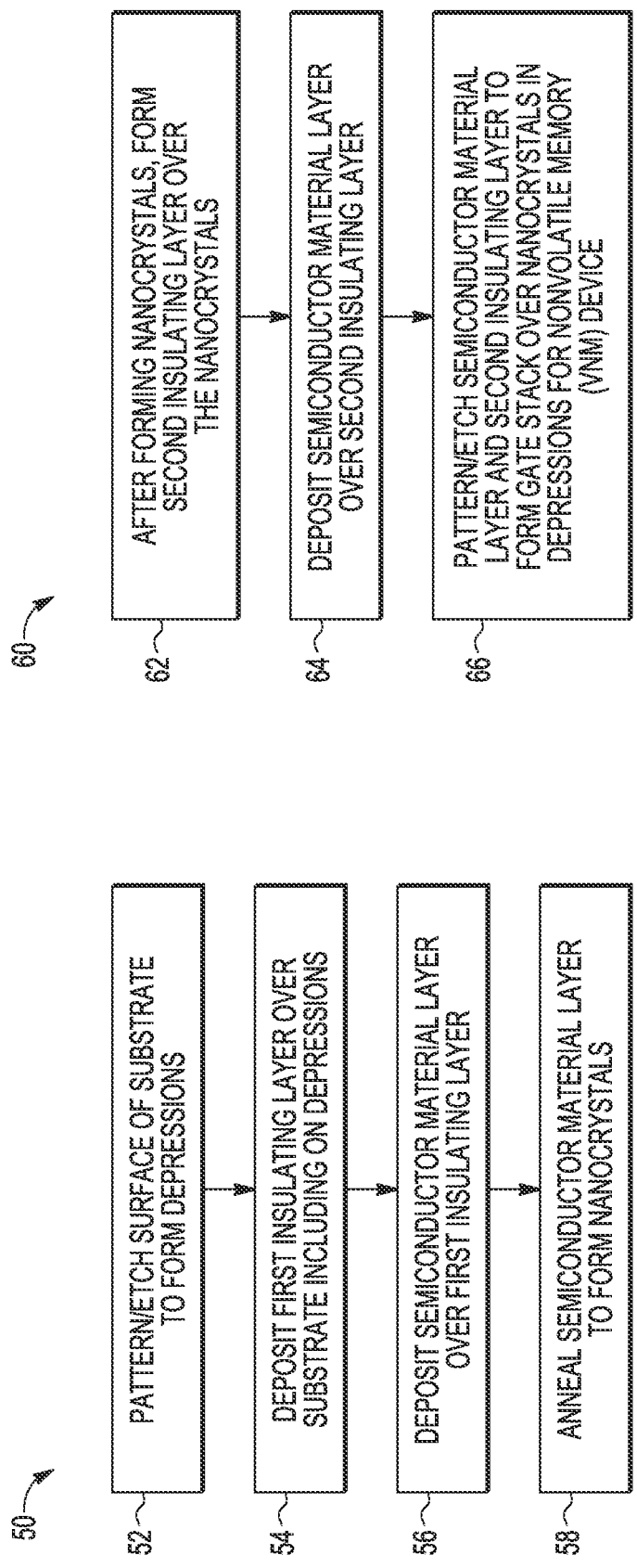

METHOD TO FORM SELF-ALIGNED HIGH DENSITY NANOCRYSTALS

FIELD OF THE INVENTION

The disclosure relates generally to semiconductor processes and devices, and more particularly to methods for forming semiconductor devices having nanocrystals, and to nanocrystal storage devices.

BACKGROUND OF THE INVENTION

Nonvolatile data storage is commonly used in integrated circuits. Conventional nonvolatile transistor memory cells commonly include a polysilicon floating gate formed over a tunnel dielectric over a semiconductor substrate as a charge storage region. Some types of semiconductive devices for nonvolatile data storage use isolated nanocrystals (also referred to as nanoparticles) to replace the floating gate as a charge storage area. Charge is transferred through the tunnel dielectric (also referred to as tunnel oxide) to the nanocrystal layer. The electrostatic properties of the nanocrystal layer are modified, which influences a subsurface channel region between source and drain in a MOS transistor to represent various logical values. The charge capturing capability of the nanocrystals is affected by the density, size and distribution of the nanocrystals. The nanocrystals are distributed over the channel region and should be capable of holding a sufficient charge. Too few nanocrystals may not be able to control the channel.

In order to have a significant memory effect, it is necessary to have a high density of nanocrystals forming the charge storage regions. Current methods form nanocrystals using, for example, a chemical vapor deposition (CVD) technique to deposit a semiconductor material over a substrate. The material is then annealed to form the nanocrystals.

As the size of semiconductor devices scale down to 40 nm and beyond, the number of nanocrystals per bit cell dwindles. Consequently, with ever shrinking devices, nanocrystal distribution in a charge storage area increasingly impacts bit cell performance and reliability. To extend current nanocrystal technology to the next node as a storage source, formation of a required density of nanocrystals within a bit cell, particularly in conjunction with the channel region of a control gate or memory gate, is desired.

BRIEF DESCRIPTION OF THE DRAWINGS

Embodiments of the present invention are illustrated by way of example and are not limited by the accompanying figures, in which like references indicate similar elements. Elements in the figures are illustrated for simplicity and clarity and have not necessarily been drawn to scale.

FIG. 29 is a flow chart illustrating a method of forming nanocrystals according to an embodiment of the invention, given by way of example.

FIG. 30 is a flow chart illustrating a method of forming a nonvolatile memory (NVM) device in conjunction with the method illustrated in FIG. 29, according to an embodiment of the invention, given by way of example.

DETAILED DESCRIPTION

Embodiments of the invention generally include methods for forming a high density of self-aligned nanocrystals over a substrate or over tunnel oxide, and semiconductor devices such as nonvolatile memory (NVM) devices configured with a plurality of nanocrystals that function as a charge storage area.

Embodiments disclosed herein provide nanocrystals in a highly dense array within trenches or other controlled depressions or indentations that are patterned on the surface of an insulating layer (e.g., tunnel oxide). By providing intentional, structured sites (e.g., trenches) which are preferred for nanocrystal nucleation and formation, a dense distribution of nanocrystals can be provided at desired locations or the substrate, rather than nanocrystals having a random distribution over the substrate. With methods of embodiments of the invention, nanocrystals are readily grown and self-align on the depressions formed in the insulating layer. The pattern of depressions provides nucleation sites at desired locations on the surface of the insulating layer to seed the growth of nanocrystals from deposited material. The concentration of nanocrystals in specific areas provides a highly dense charge storage area. A charge storage area formed by the nanocrystals on the depressions can readily scale with reduced dimensions (length, width) of a control or memory gate. Nanocrystal charge storage area formed according to embodiments of the invention have improved reliability and program/erase performance for next node split gate nonvolatile memory (NVM) devices (e.g., N+1, N+2).

Figure 1:
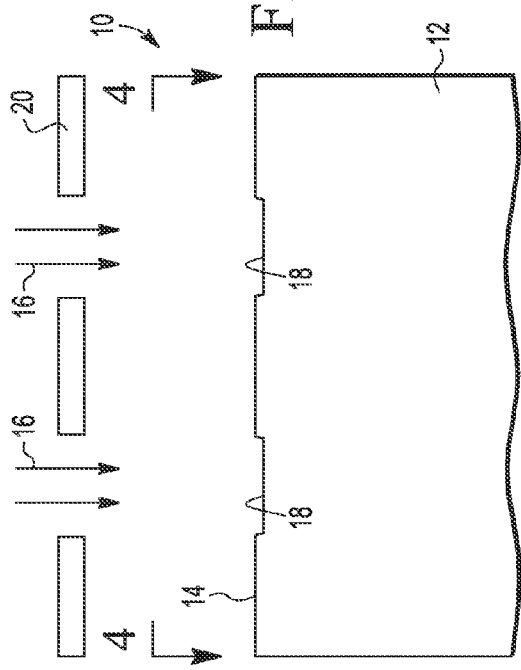
FIG. 1 is a cross-sectional, schematic, elevational view of a portion of a semiconductor device, in progress according to an embodiment of a method according to the invention.
Figure 2:
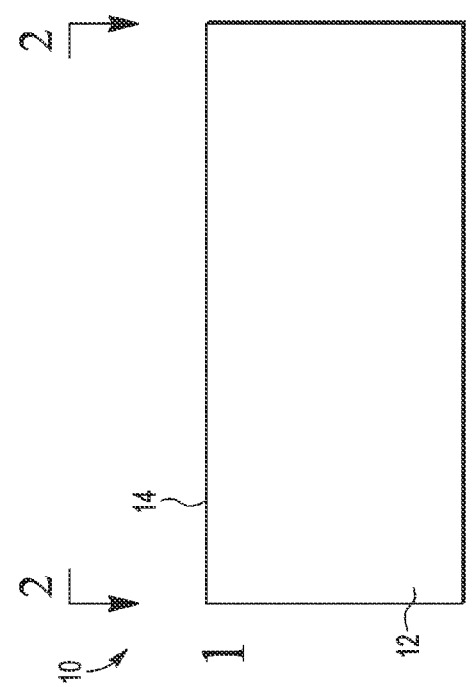
FIG. 2 is a plan view of the semiconductor device of FIG. 1 taken along lines 2-2.

FIGS. 1-2 illustrate an embodiment of a semiconductor device 10 having a substrate 12. In embodiments, the substrate 12 can be a semiconductor material or combination of materials such as, for example, polycrystalline silicon, monocrystalline silicon, amorphous silicon, gallium arsenide, silicon germanium, silicon-on-insulator (SOI), among other semiconductive material.

Figure 3:
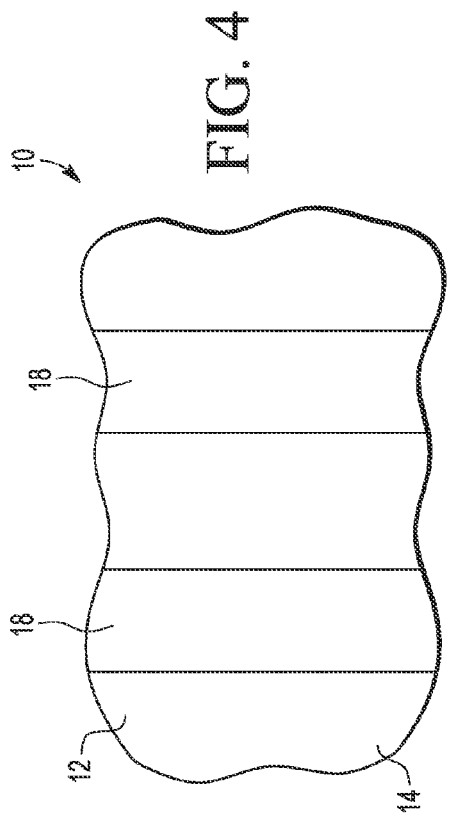
FIG. 3 is a cross-sectional, schematic, elevational view of the semiconductor device of FIG. 1 at a subsequent process step, showing depressions formed as trenches in the semiconductor substrate.
Figure 4:
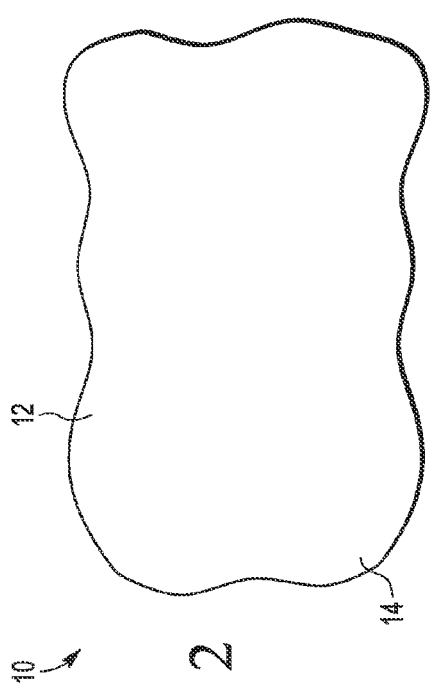
FIG. 4 is a plan view of the semiconductor device of FIG. 3 taken along lines 4-4.

FIGS. 3-4 illustrate semiconductor device 10 at a subsequent stage in processing in which the surface 14 of the semiconductor substrate 12 is etched (arrows 16) to form depressions 18 in a desired pattern in the semiconductor substrate 12. A conventional masking and etching process can be used to etch the substrate 12. In embodiments, etching of the substrate 12 can be performed through a patterned mask 20 such as a photoresist of other type of patternable material that can be selectively removed. The mask 20 covers some of the substrate 12 and leaves desired areas exposed. The exposed areas of the semiconductor substrate 12 can then be etched, for example, by a conventional dry or wet etch process.

The depressions 18 can be formed in a variety of shapes and dimensions according to the application and device node. In some embodiments, the length and width of the depressions can be in a range of about 20-160 nm, and the depth (d) of the depressions 18 can be in a range of about 3-80 nm, or about 20-50 nm. For example, in embodiments in which the nanocrystals form a charge storage area of a nonvolatile memory device, the length and width dimensions of the depressions are less than the length and width dimensions of the overlying gate. The depth of the depressions is generally determined by device node and nanocrystal size and density.

Figure 5:
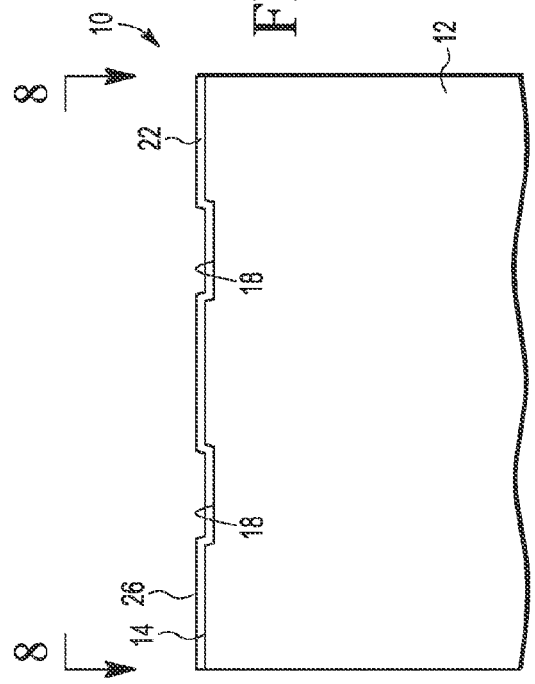
FIG. 5 is a cross-sectional, schematic, elevational view of an embodiment of a semiconductor device, showing depressions formed as concavities in the semiconductor substrate.
Figure 6:
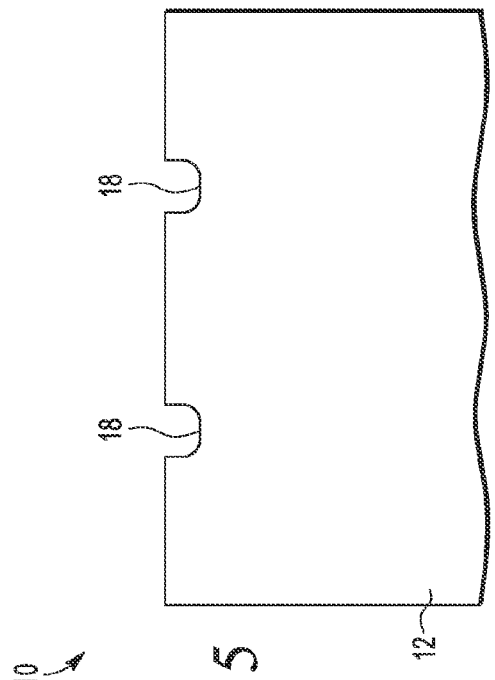
FIG. 6 is a cross-sectional, schematic, elevational view of an embodiment of a semiconductor device, showing depressions formed in a V-shape in the semiconductor substrate.

The depressions 18 can be formed, for example, as trenches, grooves, channels, divots, pits, indentations, cavities, and concavities, among other shapes and configurations. In some embodiments, the depressions 18 can be concave or angled, with sidewalls that are angled at greater than zero. As depicted in FIGS. 3-4, the depressions 18 have been formed as trenches. FIGS. 5-6 illustrate embodiments of depressions 18 in the form of concavities and V-shapes, respectively. In some embodiments, the depressions 18 can be formed, for example, as one or more elongate trenches, channels or grooves. In some embodiments, the depressions can be formed, for example, as a patterned array of divots, pits, indents, cavities, and/or short trenches, channels or grooves, among other configurations.

Figure 7:
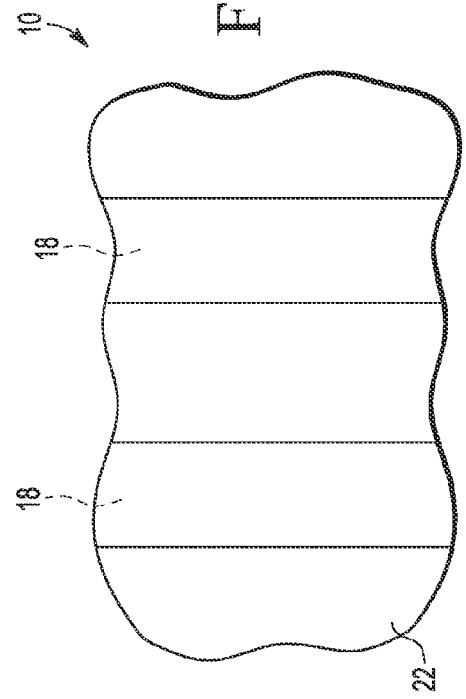
FIG. 7 is a cross-sectional, schematic, elevational view of the semiconductor device of FIG. 3 at a subsequent process step, showing an insulating layer formed over the semiconductor substrate.
Figure 8:
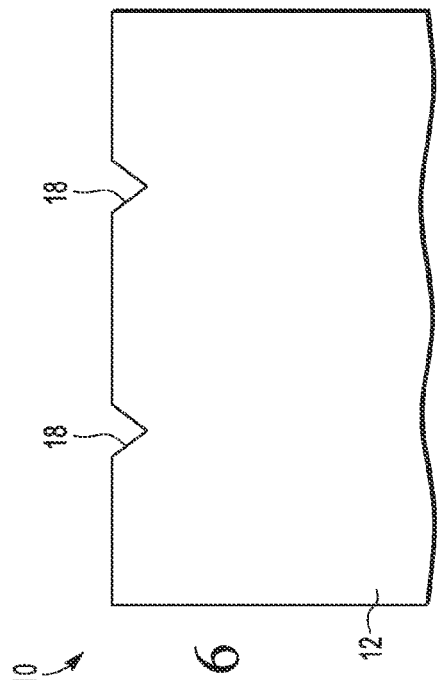
FIG. 8 is a plan view of the semiconductor device of FIG. 7 taken along lines 8-8.

FIGS. 7-8 illustrate semiconductor device 10 in a subsequent process step after forming an insulating layer 22 over the surface the semiconductors of substrate 12, including on the depressions 18 (e.g., trenches). Insulating layer 22 (also called a tunnel dielectric or tunnel oxide) can be formed over substrate 12 using conventional growth or deposition processes. Insulating layer 22 can be, for example, $SiO_2$, HfAlO, $HfO_2$, ONO, SiON, SiN, or other dielectric or insulative material, including high dielectric constant material such as alumina, titanium dioxide, hafnium dioxide, tantalum dioxide, and the like.

Figure 9:
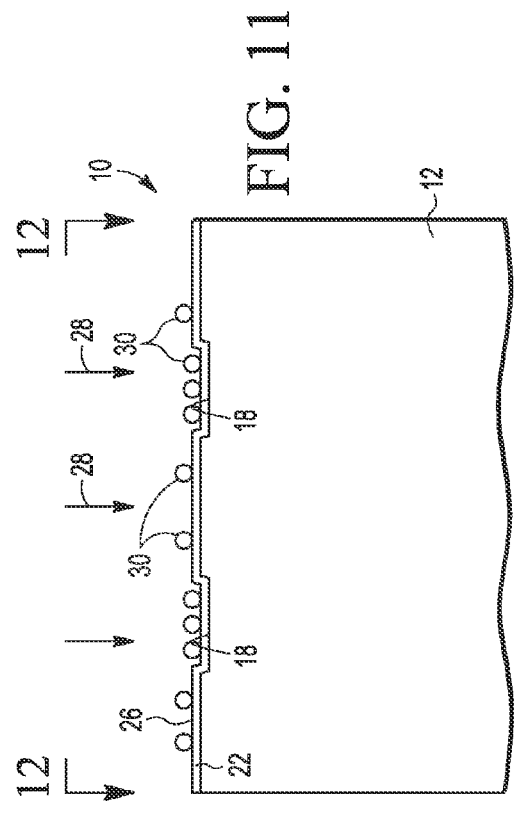
FIG. 9 is a cross-sectional, schematic, elevational view of the semiconductor device of FIG. 7 at a subsequent process step, showing a semiconductor layer formed over the insulating layer.
Figure 10:
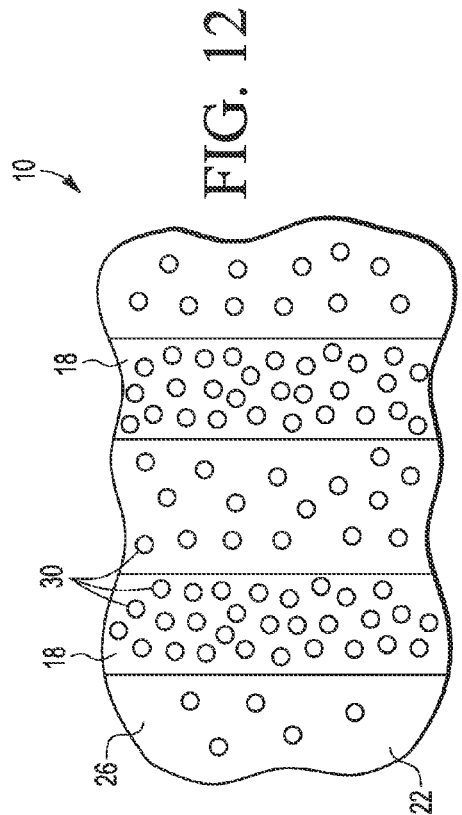
FIG. 10 is a plan view of the semiconductor device of FIG. 9 taken along lines 10-10.

FIGS. 9-10 illustrate semiconductor device 10 in a subsequent process step after forming a semiconductor layer 24 over the insulating layer 22. The deposition step can be performed using chemical vapor deposition (CVD), plasma enhanced chemical vapor deposition (PECVD), or epitaxy (EPI). In an embodiment, the substrate 12 can be placed in a deposition chamber and a precursor gas flowed into the chamber to form a thin semiconductor layer 24 on the insulating layer 22. For example, an amorphous silicon layer 24 can be formed by depositing a silicon precursor gas, such as silane ($SiH_4$) or disilane ($Si_2H_6$), for example, using a conventional CVD process. Deposition time will generally determine the thickness of the deposited layer 24. In an embodiment, for example, the thickness of the semiconductor layer 24 (e.g., amorphous silicon) can be about 3-20 nm. In general, the deposition temperature should not be so high as to cause annealing and formation of nanocrystals during the deposition step in order to control the thickness of the semiconductor (e.g., amorphous silicon) layer 24.

The depressions 18 provide nucleation sites having a lower surface energy, and thus a lower nucleation barrier, which promote and facilitate nucleation of the semiconductive material. The depressions 18 reduce the contact angle (e.g., wetting angle) of the depositing semiconductor material 24 (e.g., amorphous silicon) with the surface 26 of the insulating layer 22. This in turn reduces the nucleation barrier resulting in enhanced and faster nucleation and growth rates on the depressions 18.

Figure 11:
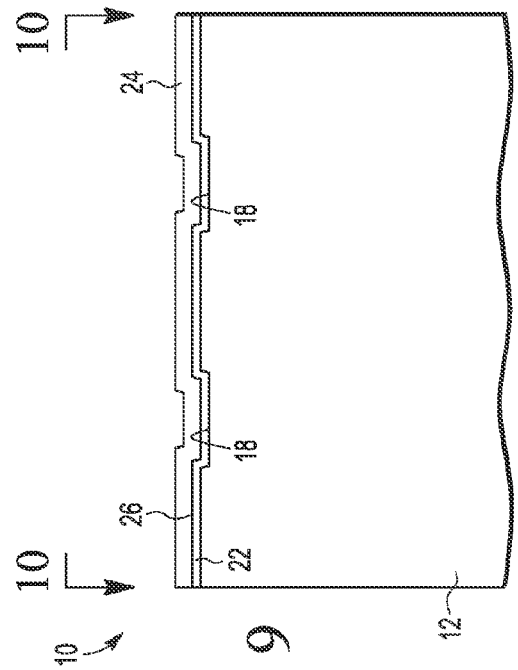
FIG. 11 is a cross-sectional, schematic, elevational view of the semiconductor device of FIG. 9 at a subsequent process step, showing nanocrystals formed from the semiconductor layer over the insulating layer.
Figure 12:
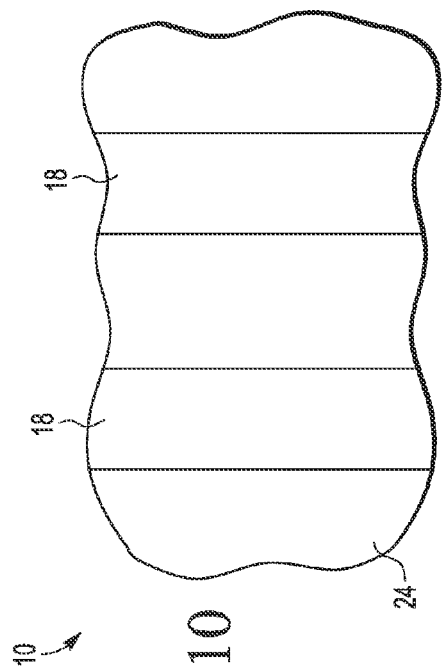
FIG. 12 is a plan view of the semiconductor device of FIG. 11 taken along lines 12-12.

FIGS. 11-12 illustrate semiconductor device 10 in a subsequent state in processing in which the semiconductor layer 24 (e.g., amorphous silicon) is annealed (arrows 28) to form nanocrystals 30 capable of storing a charge. In an embodiment, the anneal of an amorphous silicon layer 24 can be performed in an ambient (e.g., one or more gases) that does not contain oxygen. For example, the ambient can be nitrogen, an inert gas (e.g., argon), or a combination thereof. By way of example, an anneal of amorphous silicon layer 24 can be performed at a temperature of about 600-800° C., for a time period of about 5-120 seconds.

Annealing the semiconductor layer 24 results in the formation of a plurality of individual, discrete nanocrystals 30 (also called nanoparticles) which are dispersed over the surface 26 of the insulating layer 22 with a higher density of nanocrystals on the depressions 18. The anneal causes the semiconductor (e.g., amorphous silicon) layer 24 to dewet from the insulating layer and form the nanocrystal structures. The nanocrystals 30 are physically separated from each other. In embodiments, for example, the nanocrystals 30 can have an average diameter of about 3-20 nm.

The depressions 18 create a difference in surface adhesion on the surface 26 of the insulating layer 22. This difference in surface tension or energy makes the depressions 18 preferred sites for nucleation and crystal formation of the semiconductor layer 24 (e.g., amorphous silicon) such that the nanocrystals self-align on the insulating layer within the depressions 18.

The nanocrystals 30 are generally uniformly distributed over the surface 26 of the insulating layer 22 outside the depressions 18, for example, at a density of about 1E11 to 3E11 nanocrystals per cm². In some embodiments, the number of nanocrystals 30 on the depressions 18 is about 1.5 times more than the number of nanocrystals on the insulating layer 22 outside the depressions.

Referring now to FIGS. 13-28, in an embodiment, the nanocrystals 30 are formed as a charge storage area for a nonvolatile memory (NVM) device.

Figure 13:
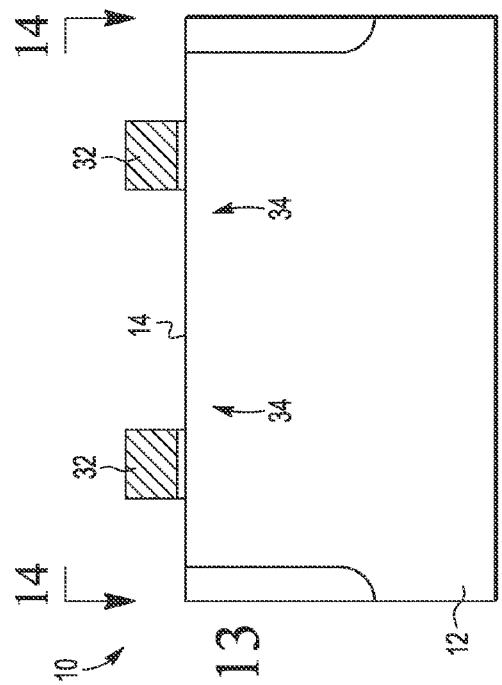
FIG. 13 is a cross-sectional, schematic, elevational view of a portion of a semiconductor device, in progress according to an embodiment of a method for forming a nonvolatile memory device according to the invention.
Figure 14:
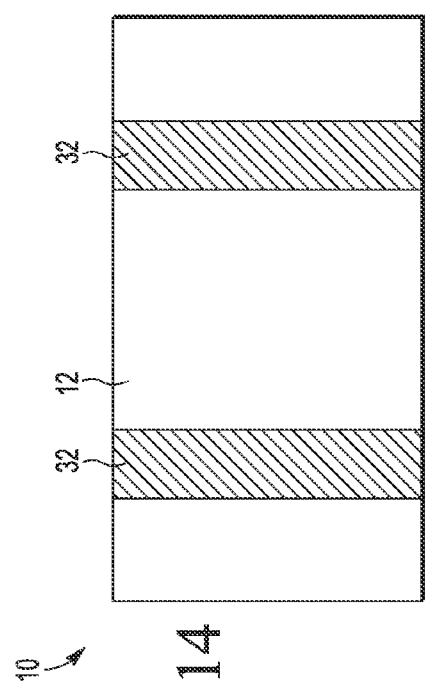
FIG. 14 is a plan view of the semiconductor device of FIG. 13 taken along lines 14-14.

FIGS. 13-14 illustrate an embodiment of a semiconductor device 10 composed of two select gates 32 on a semiconductor substrate 12 having channel regions 34 formed in the substrate 12 between a source region 36 and drain regions 38.

Figure 15:
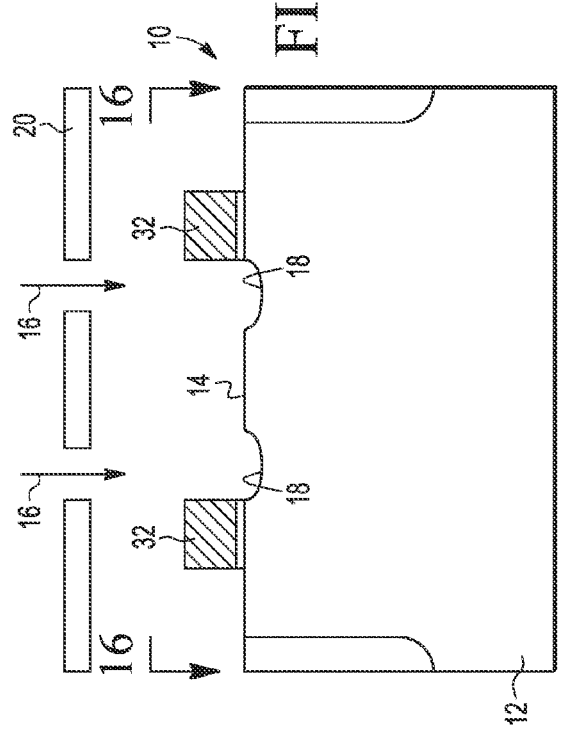
FIG. 15 is a cross-sectional, schematic, elevational view of the semiconductor device of FIG. 13 at a subsequent process step, showing depressions formed as trenches in the semiconductor substrate.
Figure 16:
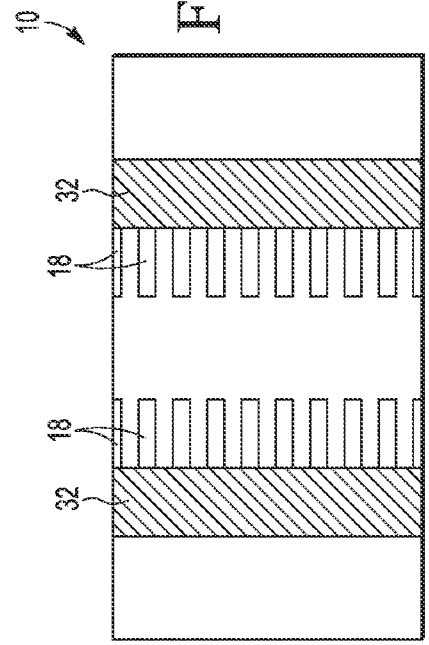
FIG. 16 is a plan view of the semiconductor device of FIG. 15 taken along lines 16-16.

As shown in FIGS. 15-16, the surface 14 of the semiconductor substrate 12 is selectively etched (arrows 16) through a mask 20 to form depressions 18 adjacent to the select gates 32. As depicted, in some embodiments the depressions 18 can be in the form of pits. For illustrative purposes, the pits can have, for example, a depth (d) of about 3 nm.

Figure 17:
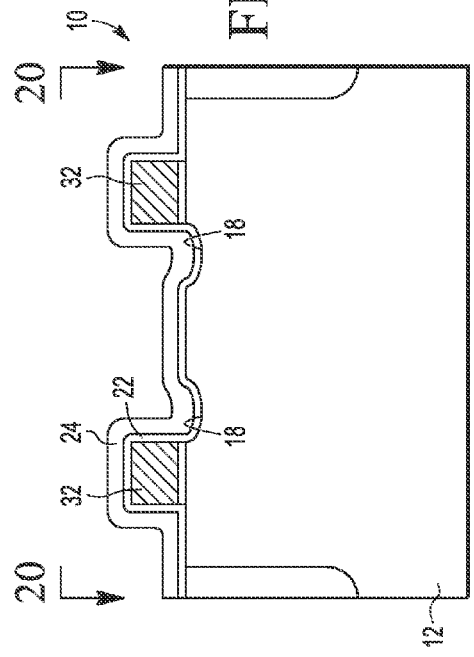
FIG. 17 is a cross-sectional, schematic, elevational view of the semiconductor device of FIG. 15 at a subsequent process step, showing an insulating layer formed over the semiconductor substrate.
Figure 18:
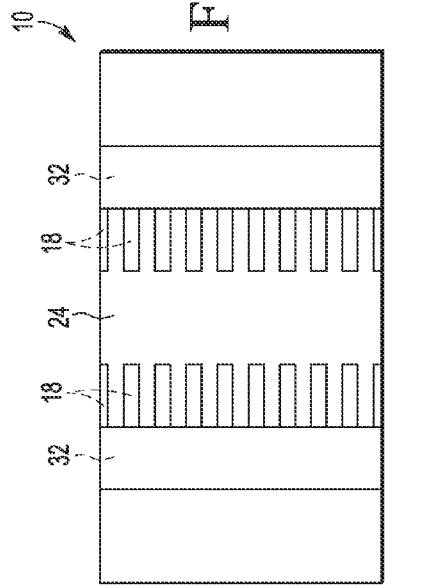
FIG. 18 is a plan view of the semiconductor device of FIG. 17 taken along lines 18-18.

As depicted in FIGS. 17-18, an insulating layer 22 (also called a tunnel or gate oxide) is formed over the semiconductor substrate 12, including onto the depressions (pits) 18. The insulating layer 22 typically has a thickness of about 3-10 nm. Typical materials for insulating layer 22 include, for example, $SiO_2$, HfAlO, $HfO_2$, ONO, SiON, SiN, or other dielectric or insulating material including high dielectric constant materials.

Figure 19:
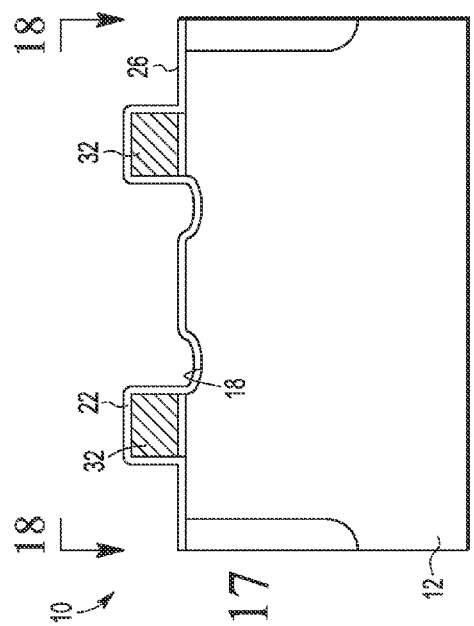
FIG. 19 is a cross-sectional, schematic, elevational view of the semiconductor device of FIG. 17 at a subsequent process step, showing a semiconductor layer formed on the insulating layer.
Figure 20:
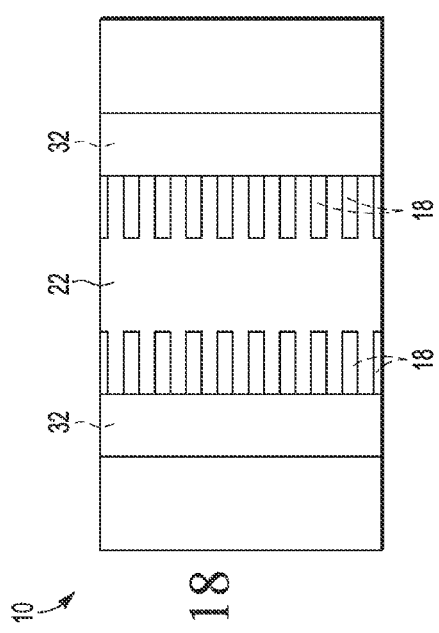
FIG. 20 is a plan view of the semiconductor device of FIG. 19 taken along lines 20-20.

Referring to FIGS. 19-20, to form the charge storage area, a semiconductor layer 24 (e.g., amorphous silicon) is deposited over the insulating layer 22. For illustrative purposes, the thickness of the semiconductor (e.g., amorphous silicon) layer 24 on the pits 18 is about 3-20 nm.

Figure 21:
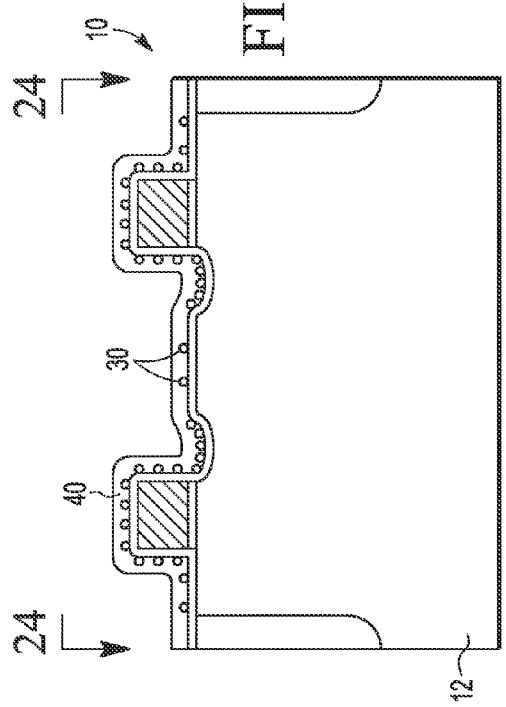
FIG. 21 is a cross-sectional, schematic, elevational view of the semiconductor device of FIG. 19 at a subsequent process step, showing nanocrystals formed from the semiconductor layer on the insulating layer.
Figure 22:
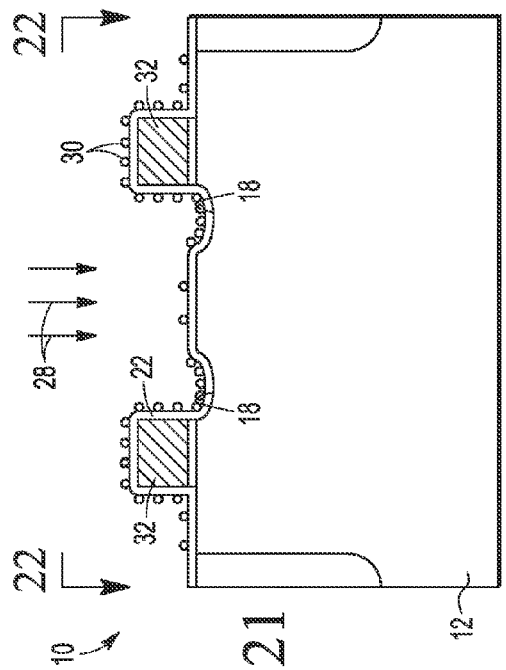
FIG. 22 is a plan view of the semiconductor device of FIG. 21 taken along lines 22-22.

As illustrated in FIGS. 21-22, the semiconductor (e.g., amorphous silicon) layer 24 is then annealed (arrows 28) to form a plurality of individual, discrete nanocrystals 30 distributed over the surface 26 of the insulating layer 22, including on the pits 18. The nanocrystals 30 self-align onto the pits and are randomly distributed over the insulating layer 22 outside the pits. The density of the nanocrystals 30 is greater on the surface 26 of the insulating layer 22 on the pits 18 than outside the pits. In some embodiments, about 1.5 times more nanocrystals are situated on the insulating layer 22 on the pits 18 than outside the pits. The nanocrystals 30 are spaced apart and electrically isolated from each other. The nanocrystals 30 within and adjacent to the pits 18 function as a charge storage area capable of storing a charge. In embodiments, for the charge storage area, the average diameter of the nanocrystals can be about 3-20 nm, with an average spacing between nanocrystals at about 5-20 nm. In embodiments, the density of the nanocrystals 30 on the trenches can be about 1E10 to 5E11 nanocrystals per cm².

Figure 23:
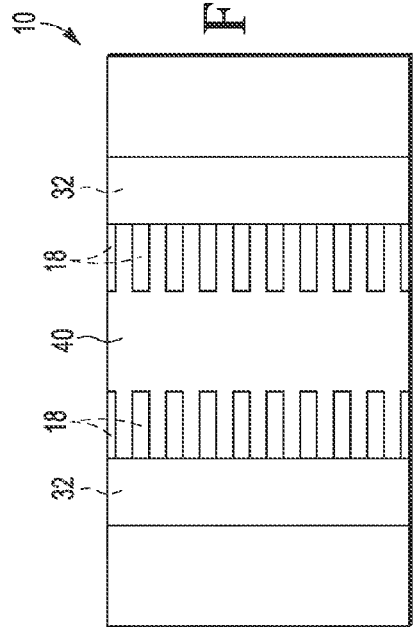
FIG. 23 is a cross-sectional, schematic, elevational view of the semiconductor device of FIG. 21 at a subsequent process step, showing the formation of an insulating layer over the nanocrystals.
Figure 24:
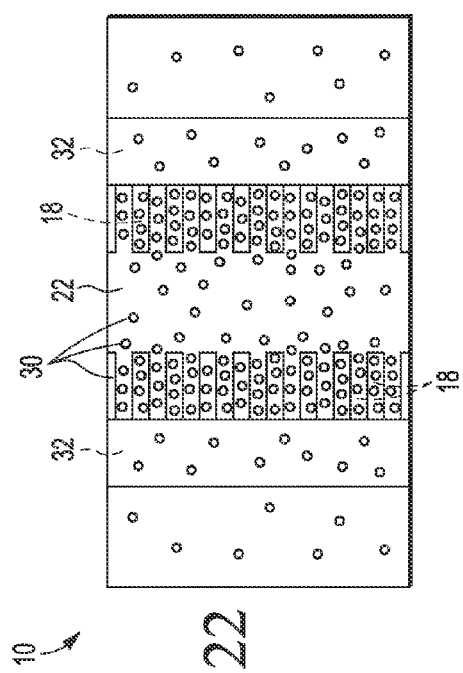
FIG. 24 is a plan view of the semiconductor device of FIG. 23 taken along lines 24-24.

FIGS. 23-24 show semiconductor device 10 at a next step in which an electrically insulating layer 40 (also called a control oxide) is formed over the nanocrystals 30. The insulating layer 40 can be formed using conventional methods of a dielectric material such as, for example, $SiO_2$, HfAlO, $HfO_2$, ONO, SiON, SiN, or other dielectric or insulating material, including high dielectric constant materials. In embodiments, the insulating layer 40 has a thickness of about 10-20 nm.

Figure 25:
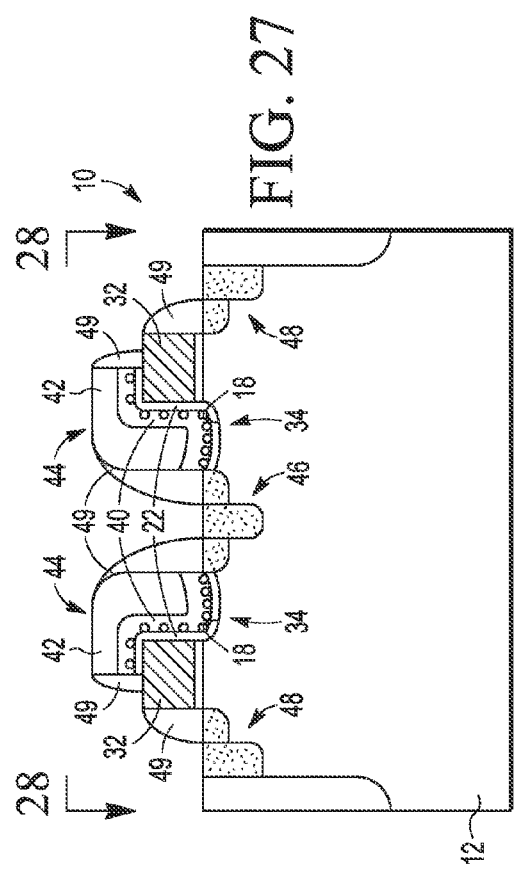
FIG. 25 is a cross-sectional, schematic, elevational view of the semiconductor device of FIG. 23 at a subsequent process step, showing the formation of a semiconductor gate layer over the insulating layer.
Figure 26:
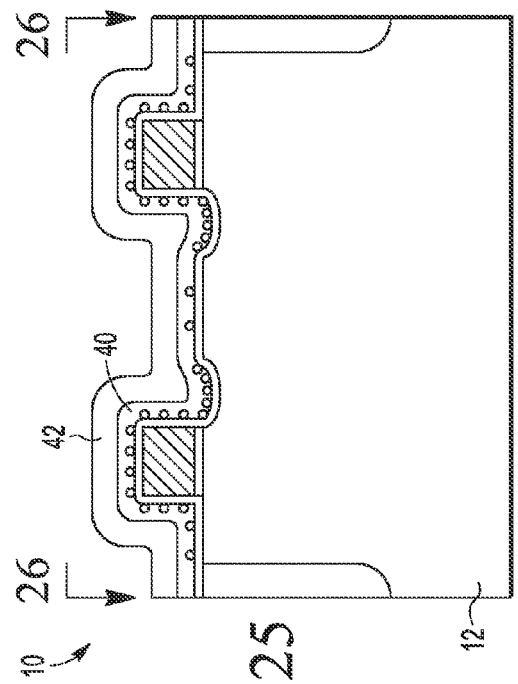
FIG. 26 is a plan view of the semiconductor device of FIG. 25 taken along lines 26-26.

As illustrated in FIGS. 25-26, a semiconductor gate layer 42 is then formed by conventional methods over the insulating layer 40, for example, by CVD. Semiconductor gate layer 42 can be, for example, polysilicon. The thickness of the semiconductor gate layer 42 is typically about 30-150 nm.

Figure 27:
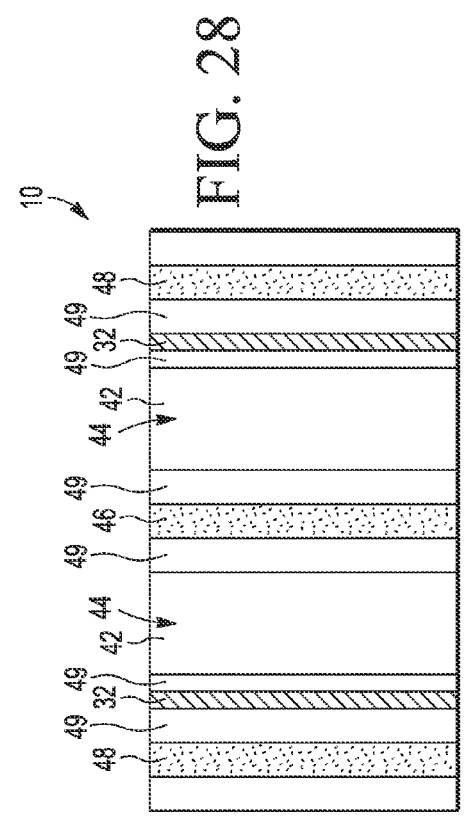
FIG. 27 is a cross-sectional, schematic, elevational view of the semiconductor device of FIG. 25 at a subsequent process step, showing the formation of a gate stack of a nonvolatile memory device.
Figure 28:
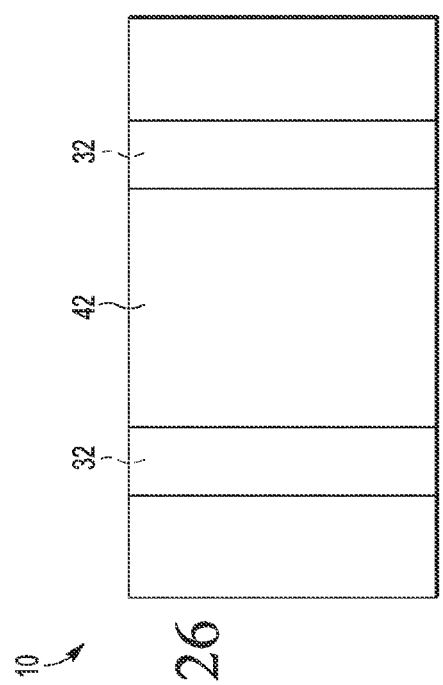
FIG. 28 is a plan view of the semiconductor device of FIG. 27 taken along lines 28-28.

FIGS. 27-28 illustrate semiconductor device 10 after patterning and etching the gate layers to expose a portion of the select gates 32 and form a gate stack 44 over the channel region 34. In embodiments, the gate stack 44 can be either a control gate or a memory gate. The gate layers 40, 42 can be patterned and etched by using conventional photolithographic processing (e.g., by dry etching) with a mask (not shown). The gate stack 44 includes a portion of the semiconductor gate layer 42 and insulating layer 40, and the nanocrystals 30 on the insulating layer 22 on the pits 18. Source and drain regions 46, 48 can be implanted in the substrate 12 by conventional methods. Insulating spacers 49 (e.g., oxide, nitride, oxynitride, or combination) can then be formed adjacent to the gate structures. The insulating spacers 49 can be formed by conformally depositing an insulating layer over the gate structures 32, 44, including exposed portions of the substrate 12. The insulating layer can be anisotropically etched to form sidewall spacers 49. The deposition and etching of the insulating layer to form the insulating spacers 49 can be performed using conventional techniques and does not require using a mask. In embodiments, a dopant can be implanted using a conventional technique into portions of the semiconductor substrate 12 that is not covered by the gate structures 32, 44 or spacers 49 to further form the source/drain regions 46, 48.

The semiconductor device 10 in FIGS. 27-28 can be used, for example, as a nonvolatile memory (NVM) device in integrated circuit or transistor devices, such as memory, logic or information handling devices and systems, including, for example, wireless systems, fiber optic systems, and computers, among others. The nanocrystals 30 on the insulating layer 22 within and adjacent to the pits 18 (or other depressions formed according to the invention) function as a charge storage area.

FIG. 29 is a flowchart illustrating an embodiment of a method 50 of forming nanocrystals according to the invention. In a first step 52, the surface of a semiconductor substrate is patterned and etched to form depressions as described herein. In a next step 54, a first insulating layer is deposited over the semiconductor substrate, including on the depressions. In a next step 56, a semiconductor material layer is deposited over the first insulating layer. In a next step 58, the semiconductor material layer is annealed to form nanocrystals on the surface of the first insulating layer.

FIG. 30 is a flowchart illustrating an embodiment of a method 60 of forming a non-volatile memory cell according to the invention, which, in embodiments, incorporates and follows the method set forth in FIG. 29. In a step 62, after forming nanocrystals on the first insulating layer, a second insulating layer is formed over the nanocrystals to form, for example, a gate oxide layer. In a next step 64, a semiconductor material layer is deposited over the second insulating layer. In a next step 66, the semiconductor material layer and second insulating layer are patterned and etched to form a gate stack over the nanocrystals in depressions, as part of a nonvolatile memory (NVM) device, for example.

The terms "top," "bottom," "over," "under," "overlying," "underlying," and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The terms "a" or "an," as used herein, are defined as one or more than one. Also, the use of introductory phrases such as "at least one," "at least two," and "one or more" in the claims should not be construed to imply that the introduction of another claim element by the indefinite articles "a" or "an" limits any particular claim containing such introduced claim element to devices, etc., containing only one such element, even when the same claim includes the introductory phrases "one or more" or "at least one" and indefinite articles such as "a" or "an." The same applies to the use of definite articles.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required or essential feature or element of any or all of the claims.

What is claimed is:

1. A method of forming nanocrystals on a substrate, comprising:
    forming a plurality of depressions in a surface of the substrate, the depressions having a depth and sidewalls;
    forming a first insulating layer over the substrate;
    forming a semiconductor layer over the first insulating layer;
    annealing the semiconductor layer to form a plurality of spaced apart nanocrystals on the first insulating layer;
    forming a second insulating layer over the nanocrystals and the first insulating layer; and
    forming a semiconductor layer over the second insulating layer;
    wherein density of the nanocrystals within the depressions is higher than density of the nanocrystals on the surface of the first insulating layer outside the depressions.

2. The method of claim 1, wherein forming the depressions comprises masking and etching the surface of the substrate.

3. The method of claim 1, wherein the substrate comprises a semiconductor material.

4. The method of claim 3, wherein the semiconductor material is selected from the group consisting of polycrystalline silicon, monocrystalline silicon, amorphous silicon, gallium arsenide, silicon germanium, and silicon-on-insulator (SOI).

5. The method of claim 1, wherein the depressions are in a form selected from the group consisting of trenches, grooves, pits, indentations, cavities, concavities, and V-shapes.

6. The method of claim 1, wherein sidewalls of the depressions are angled at greater than zero.

7. The method of claim 1, wherein the depth of the depressions is about 3-80 nm.

8. The method of claim 1, wherein the semiconductor layer comprises amorphous silicon.

9. The method of claim 1, wherein the nanocrystals within the depressions have an average diameter of about 3-20 nm.

10. The method of claim 1, wherein the nanocrystals are separated from each other by a distance of about 5-20 nm.

11. The method of claim 1, wherein the density of the nanocrystals is about 1E11 to 5E11 nanocrystals per $cm^2$.

12. The method of claim 11, wherein the density of the nanocrystals on the first insulating layer on the depressions is greater than the density of nanocrystals outside the depressions.

13. The method of claim 12, wherein about 1.5 times more nanocrystals are situated on the first insulating layer on the depressions.

14. A method of forming a nonvolatile memory device, comprising:
    providing a semiconductor substrate having a source region, a drain region and a channel region therebetween;
    patterning and etching a plurality of depressions in a surface of the semiconductor substrate opposite the channel region, the depressions having a depth and sidewalls;
    forming a first insulating layer over the semiconductor substrate including on the depressions;
    forming a semiconductor layer over the first insulating layer;
    annealing the semiconductor layer to form a plurality of nanocrystals on the insulating layer;
    forming a second insulating layer over the nanocrystals;
    forming a semiconductor layer over the second insulating layer; and
    patterning the semiconductor layer and the second insulating layer to form a gate stack;
    wherein the plurality of nanocrystals on the depressions are capable of storing an electrical charge.

15. The method of claim 14, wherein a select gate is situated on the semiconductor substrate, and the depressions are patterned and etched in the surface of the semiconductor substrate laterally adjacent sidewalls of the select gate.

* * * * *